United States Patent
Kwag et al.

(10) Patent No.: US 8,039,734 B2
(45) Date of Patent: Oct. 18, 2011

(54) ELECTRODE PASTE FOR SOLAR CELL, SOLAR CELL USING THE PASTE, AND FABRICATION METHOD OF THE SOLAR CELL

(75) Inventors: Gyea Young Kwag, Seoul (KR); Young Sung Yang, Seoul (KR); Seong-Eun Lee, Seoul (KR); Jeong Beom Nam, Seoul (KR); Sung Jin Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 12/779,631

(22) Filed: May 13, 2010

(65) Prior Publication Data

US 2011/0000531 A1    Jan. 6, 2011

(30) Foreign Application Priority Data

Jul. 6, 2009   (KR) .................. 10-2009-0061251

(51) Int. Cl.
*H01L 31/0256*   (2006.01)
*H01L 31/0232*   (2006.01)
*H01L 31/18*   (2006.01)

(52) U.S. Cl. ... 136/255; 136/252; 438/72; 257/E31.127; 252/514

(58) Field of Classification Search .................. 252/514
See application file for complete search history.

(56) References Cited

U.S. PATENT DOCUMENTS

| | | | |
|---|---|---|---|
| 4,104,091 A * | 8/1978 | Evans et al. ..................... 438/57 |
| 2007/0186970 A1* | 8/2007 | Takahashi et al. ............ 136/255 |
| 2009/0101872 A1* | 4/2009 | Young et al. .................. 252/514 |
| 2009/0266409 A1* | 10/2009 | Wang et al. .................. 136/252 |

FOREIGN PATENT DOCUMENTS

| | | | |
|---|---|---|---|
| JP | 07-297429 A | 11/1995 |
| JP | 2001-313400 A | 11/2001 |
| JP | 2005-243500 A | 9/2005 |
| KR | 10-0801167 B1 | 1/2008 |

* cited by examiner

*Primary Examiner* — Jennifer K. Michener
*Assistant Examiner* — Magali P Slawski
(74) *Attorney, Agent, or Firm* — McKenna Long & Aldridge LLP

(57) ABSTRACT

An electrode paste for a solar cell, a solar cell electrode using the paste, a solar cell having such an electrode, and a fabrication method of the solar cell are described. The paste for a solar cell electrode comprises a first component that includes silver (Ag) or a metal alloy containing the silver (Ag); a second component that includes zinc (Zn), and at least one selected from a group consisting of silicon (Si), aluminum (Al), copper (Cu), manganese (Mn), bismuth (Bi), phosphorous (P), boron (B), barium (Ba), and palladium (Pd); a leaded or lead-free glass frit; and a resin binder that is dispersed in an organic medium.

12 Claims, 5 Drawing Sheets

[Figure 1]
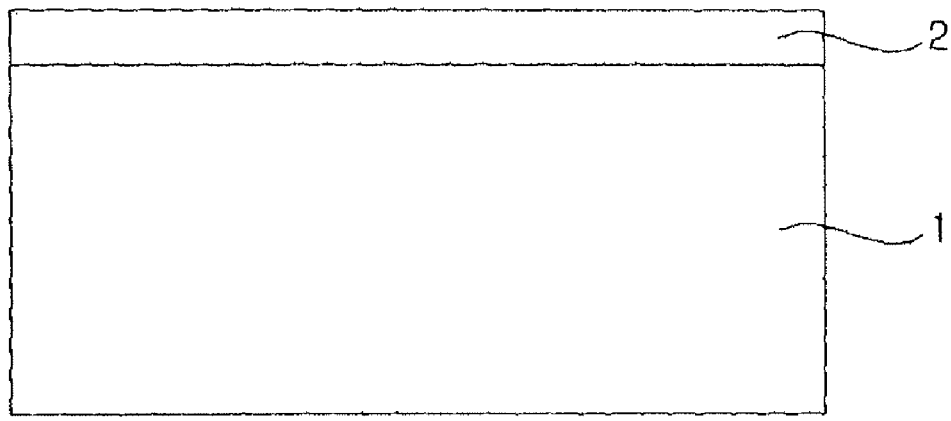
[Figure 2]
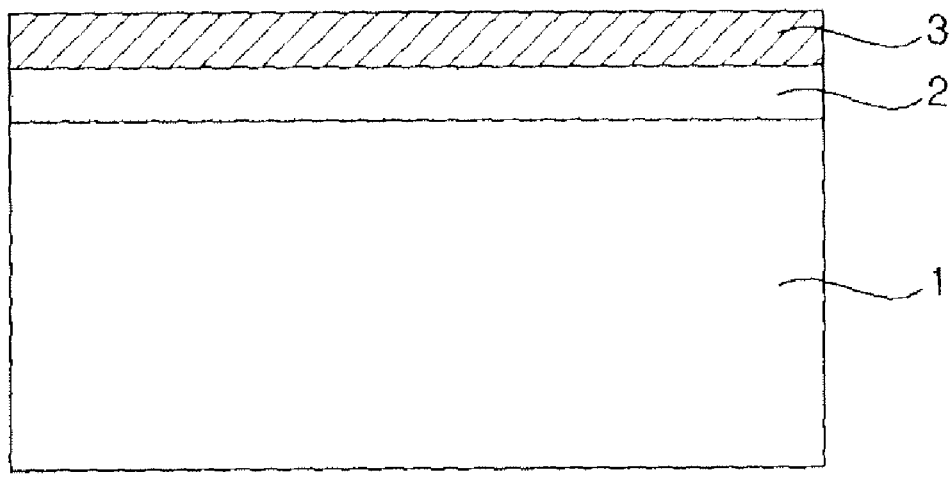

[Figure 3]
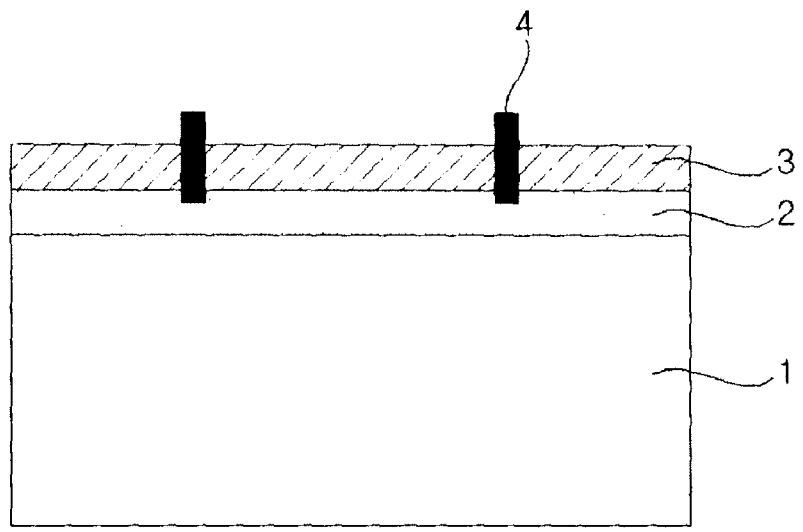
[Figure 4]
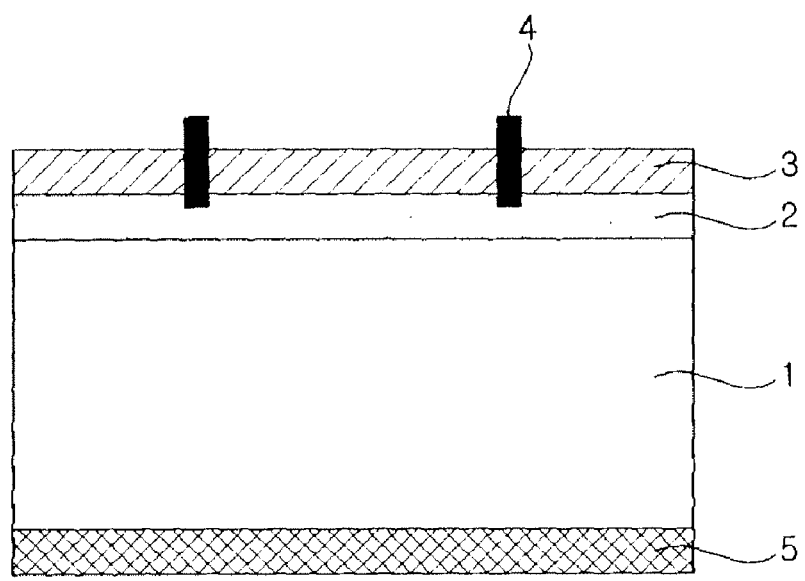

【Figure 5】
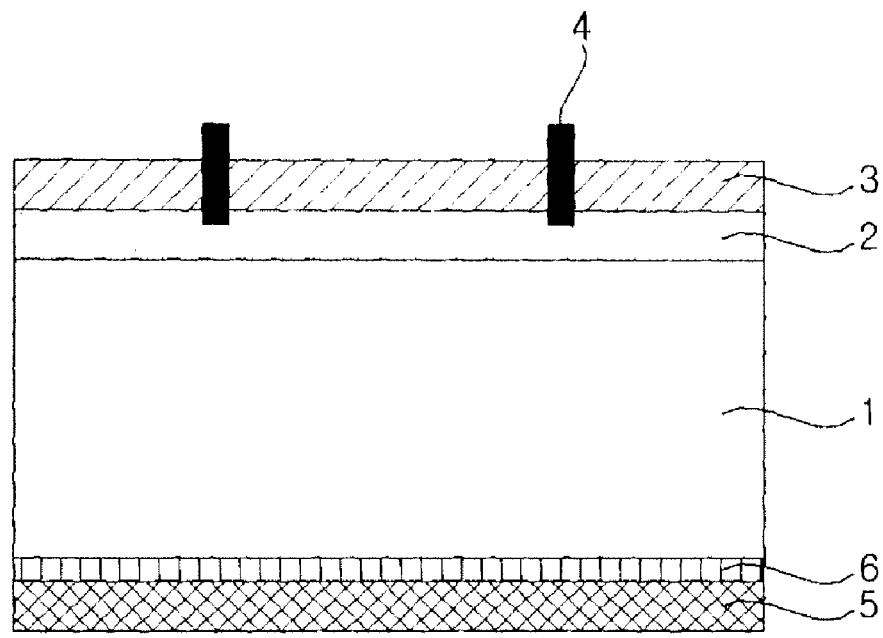
【Figure 6】
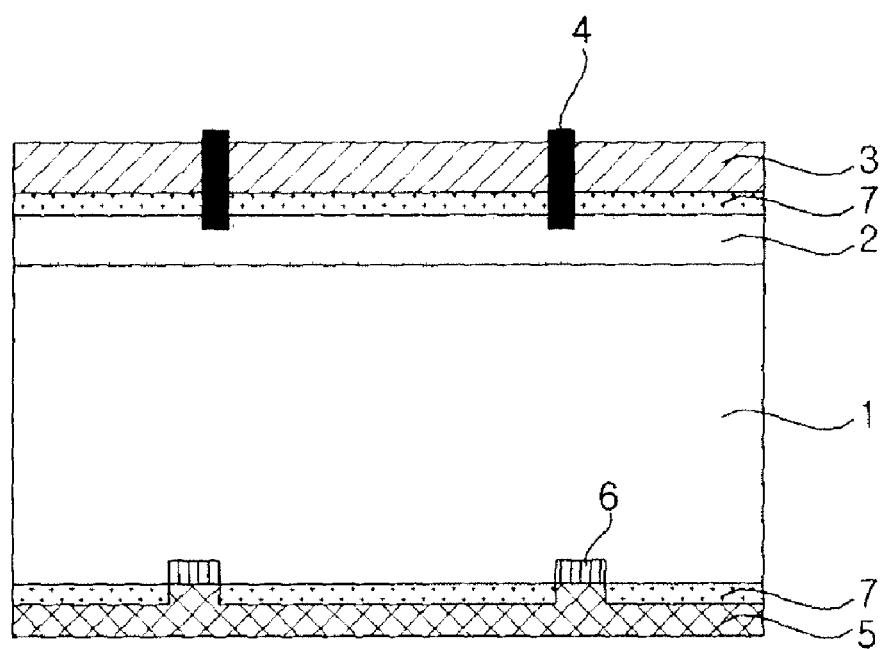

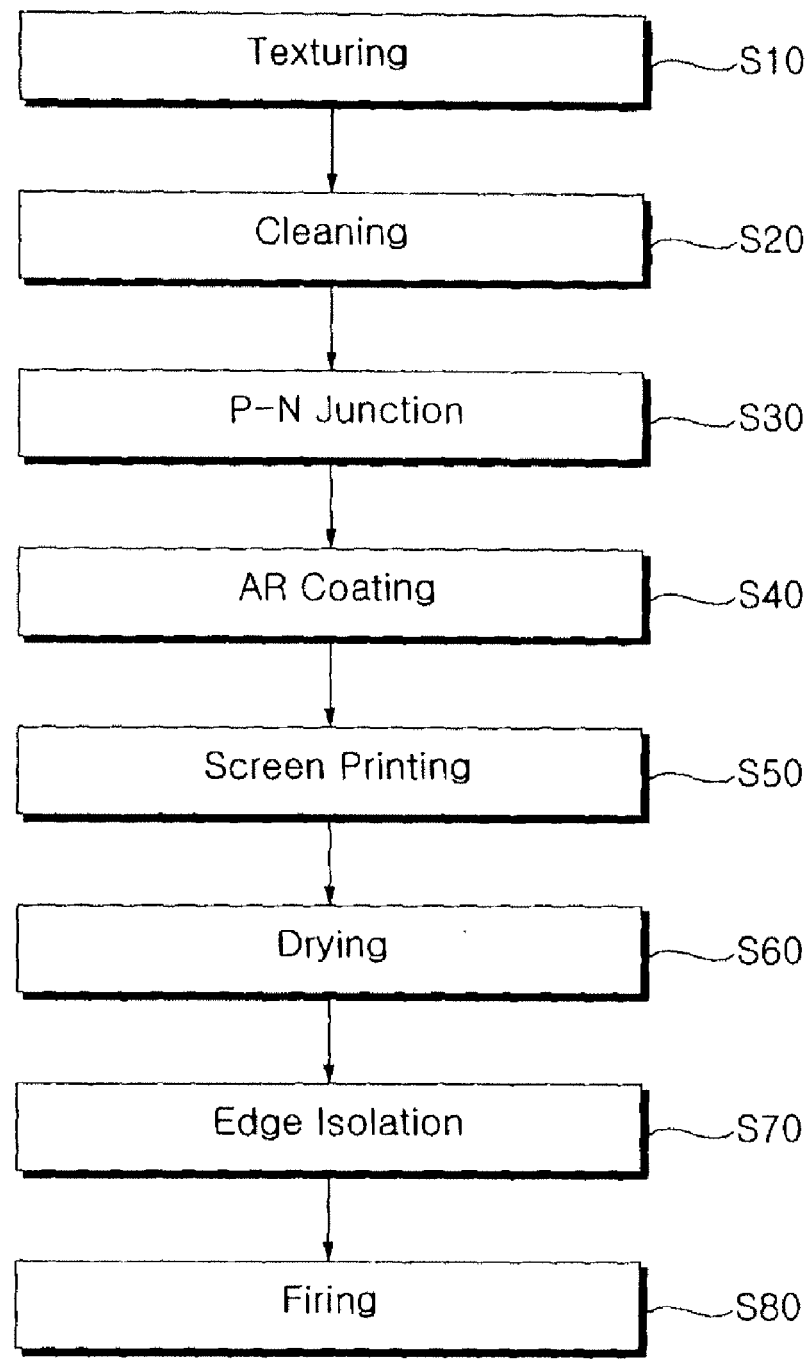
[Figure 7]

[Figure 8]
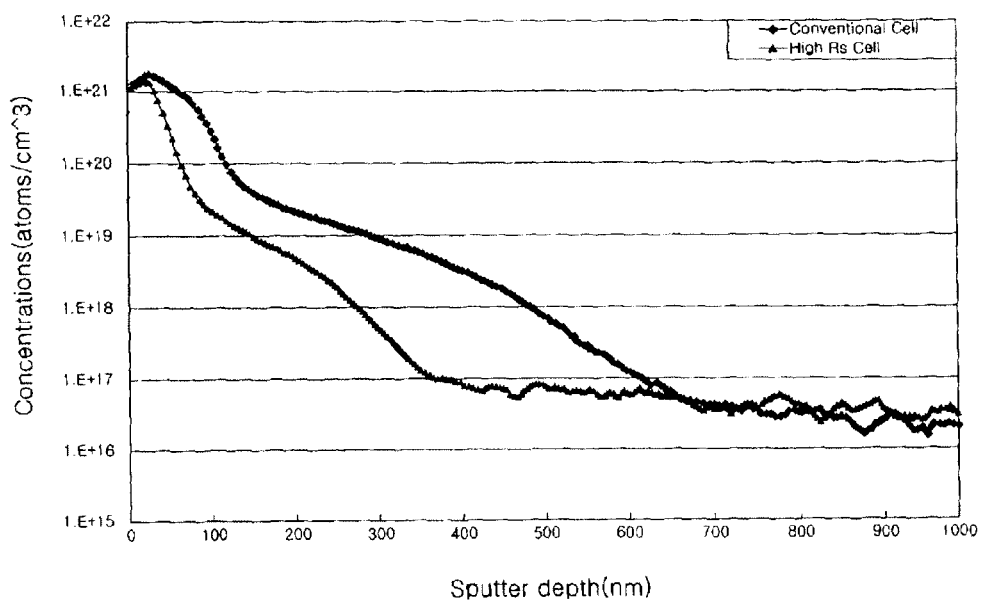

ELECTRODE PASTE FOR SOLAR CELL, SOLAR CELL USING THE PASTE, AND FABRICATION METHOD OF THE SOLAR CELL

This application claims the benefit of Korean Patent Application No. 10-2009-0061251 filed on Jul. 6, 2009, which is hereby incorporated by reference for all purposes as if fully set forth herein.

FIELD OF THE INVENTION

The present invention relates to an electrode paste for a solar cell, a solar cell electrode using the electrode paste, a solar cell having an electrode along with the paste, and a method of fabricating the solar cell, and more specifically, to an electrode paste which improves the efficiency of a solar cell by controlling the depth of the emitter in a silicon solar cell.

BACKGROUND OF THE INVENTION

Because of the rapid rise in oil prices, environmental concerns, the exhaustion of fossil energy, waste treatment associated with nuclear power generation and the like, interest in renewable energy has dramatically increased. In particular, there has been increased interest in the research and development of solar cells, which are a pollution-free energy source.

Solar cells are been advantageous because they are a pollution-free, sustainable resource with a semi-permanent life span. It is believed solar cells can ultimately solve our energy problems.

Solar cells are categorized into various types: silicon solar cells, thin film solar cells, dye sensitized solar cells, organic polymer solar cells and the like, according to its constituent material. In particular, crystalline silicon solar cells make up the majority of solar cells throughout the world. Crystalline silicon solar cells have a higher efficiency compared to other solar cells and techniques to lower the unit cost of manufacturing is continuously being developed.

In order to further improve the efficiency of crystalline silicon solar cells, there are ongoing studies to increase the short circuit current (Isc), the open circuit voltage (Voc), and the fill factor (FF). The present invention is also concerned with improving efficiency and more specifically to an electrode paste for use with high efficiency solar cells.

there are also ongoing studies relating to ultra-thin solar cells, which are easy to handle and are very versatile. Thus, there is a need to improve the manufacturing process for forming ultra-thin emitters on ultra-thin solar cell wafers.

SUMMARY OF THE INVENTION

In accordance with a first aspect of the present invention, the various objectives and advantages are realized by a solar cell. The cell comprises, among other things, a semiconductor substrate comprising a first conductive type material and a semiconductor layer comprising a second conductive type material formed on a front surface of the semiconductor substrate, where the first conductive type material is different than the second conductive type material. The solar cell also comprises an antireflective layer formed on the semiconductor layer, a front electrode passing through the antireflective layer and contacting the semiconductor layer; and a rear electrode formed on a rear surface of the semiconductor substrate. The depth of the semiconductor layer is 100 nm to 500 nm and the front electrode comprises a first component including silver (Ag) and a second component including zinc (Zn).

In accordance with a second aspect of the present invention, the various objectives and advantages are realized by a solar cell fabrication method. The method involves forming a semiconductor layer having a depth of 100 nm to 500 nm by doping a front surface of a semiconductor substrate using a second conductive type material impurity, where the semiconductor substrate comprises a first conductive type material and the first conductive type material is different from the second conductive type material. Next, the method involves forming an antireflective layer on the semiconductor layer, printing a front electrode paste on the antireflective layer; printing a rear electrode paste on a rear surface of the semiconductor substrate and heat-treating the front electrode paste thereby causing a resulting front electrode to penetrate through the antireflective layer and make contact with the semiconductor layer, where the composition of the front electrode paste limits the penetration of the front electrode to the semiconductor layer. The rear electrode paste is then heat-treated thereby resulting in the formation of a rear electrode.

The foregoing provides exemplary embodiments of the invention. Those skilled in the art will appreciate that the exemplary embodiments are illustrative only and not intended to be in any way limiting. The various aspects, features, and advantages of the present disclosure, as defined solely by the claims, will become apparent in the detailed description set forth below.

BRIEF DESCRIPTION OF THE DRAWINGS

These aforementioned and other objects, features, aspects and advantages will be fully described in the following detailed description of exemplary embodiments, taken in conjunction with the accompanying drawings. In the drawings:

FIGS. 1 to 5 are cross-sectional views sequentially showing a fabrication method of a solar cell according to one exemplary embodiment;

FIG. 6 is a cross-sectional view showing a solar cell manufactured by the fabrication method according to the one exemplary embodiment;

FIG. 7 is a flow chart of the fabrication method according to the one exemplary embodiment; and FIG. 8 is a graph comparing the doping concentrations of a semiconductor impurity according to the sputter depths of emitter layers in a High Rs cell and an existing solar cell.

DETAILED DESCRIPTION

In the following disclosure, an electrode paste for a solar cell is described. According to one exemplary embodiment the electrode paste comprises: a first component including silver (Ag) or a metal alloy containing the silver, a second component including zinc (Zn), a leaded or a lead-free glass frit, and a resin binder that is dispersed in an organic medium.

The second component is 2 to 5 wt % based on the total wt % of the composition. In addition, the second component can include at least one selected from a group consisting of silicon (Si), aluminum (Al), copper (Cu), manganese (Mn), bismuth (Bi), phosphorous (P), boron (B), barium (Ba), and palladium (Pd).

The first component may be 80 to 85 wt % based on the total wt % of the composition, but it is not necessarily limited thereto. The phase of the first component or the second component is not particularly limited and may be a liquid phase or a solid phase. Preferably, the phase of the first component or the second component may be a solid powder.

The glass frit may or may not include lead. If it includes lead, the lead content may be 1 to 3 wt % based on the total wt % of the composition.

The resin binder is a polymer plastic compound. Any material capable of serving as a binder for binding with metal materials may be used.

The first component of 50 to 85 wt %, the second component of 2 to 5 wt %, the glass frit of 2 to 10 wt %, and the resin binder of 1 to 5 wt % based on the total wt % of the composition of the electrode paste for the solar cell according to the one exemplary embodiment may be dispersed in an organic medium of 10 to 30 wt %. According to exemplary embodiments, when the weight of the metal in the materials of the paste is the total weight, silver (Ag) is 50 to 85 wt %, zinc (Zn) is 0.2 to 5 wt %, and lead (Pb) is 0 to 2 wt %.

The high efficiency solar cell electrode according to one exemplary embodiment can be formed by printing the electrode paste having the foregoing composition materials and composition ratio on a light receiving surface of the solar cell. The paste is then thermally fired The electrode paste may be used for existing crystalline silicon solar cells and, in particular, both single crystal and polycrystalline silicon solar cells. Further the electrode paste may be applied to a solar cell with high photovoltaic efficiency including an emitter layer having high sheet resistance. In order words, the paste can be used for manufacturing an electrode of a High Rs solar cell. Such solar cells may have an emitter layer with a high sheet resistance of 60 to 120 Ω/square.

In crystalline silicon solar cells, the emitter layer formed on a substrate forms a pn junction using the substrate as a base and, because the High Rs cell has the sheet resistance of 60 to 120 Ω/square, which is higher than the emitter layer of existing crystalline solar cells with a the sheet resistance of 40 to 50 Ω/square, it has excellent photovoltaic efficiency. In other words, High Rs cells have a smaller dead layer (an area which hinders the generated electrons from forming a current due to an extra semiconductor impurity concentration) which is generated at the surface of the emitter layer adjacent the front surface of the substrate of the solar cell, thereby improving the efficiency of the solar cell.

The depth of the emitter layer of the High Rs cell may be 100 nm to 500 nm and the semiconductor impurity concentration of the emitter layer may be $1\times10^{16}$ to $1\times10^{21}$ atom/cm$^3$. In the manufacturing process of solar cells according to the related art, the depth of the emitter is formed as a shallow ultra thin type layer as described above and the semiconductor impurity is doped with a low doping concentration, making it possible to manufacture the High Rs cell.

The depth of the emitter layer of general solar cells is 60 nm or more. The depth of the emitter layer of a High Rs cell is 100 nm to 500 nm. When the electrode is formed in a High Rs cell, the electrode passes through the shallow depth of the emitter layer and may then contact the base electrode, such that a short circuit may more easily occur. In order to commercially use High Rs cells including a shallow depth emitter layer, a need exists for an electrode paste capable of preventing the short circuit state caused by contact between the electrode and the silicon substrate, due to the excess firing.

Therefore, when using the electrode paste, the fire through is slowly performed during the thermoplastic process after application. In this way, the electrode can delicately contact the shallow emitter layer, making it possible to manufacture the High Rs cell so that the quality of the cell is maintained.

A solar cell according to another exemplary embodiment may comprise a first conductive type semiconductor substrate; a second conductive type semiconductor layer, formed on a front surface of the first conductive type semiconductor substrate, having a conductive type opposite to the first conductive type; an antireflective layer that formed on the second conductive type semiconductor layer; a front electrode that penetrates through the antireflective layer and is connected to the second conductive type semiconductor layer; and a rear electrode that is formed on a rear surface of the first conductive type semiconductor substrate.

The depth of the second conductive type semiconductor layer is 100 nm to 500 nm. In addition, the front electrode may include a first component including silver (Ag) and a second component including zinc (Zn). The second electrode may include at least one selected from a group consisting of silicon (Si), aluminum (Al), copper (Cu), manganese (Mn), bismuth (Bi), phosphorous (P), boron (B), barium (Ba), palladium (Pd), etc. as the second component. The front electrode may include a lead component but it preferably does not include lead.

Further, in the front electrode the first component may be 75 to 95 wt %, the second component may be 2.5 to 8 wt %, and the glass frit may be 2.5 to 17 wt %, based on the total wt % of the composition. Moreover, the front electrode may include silver (Ag) of 50 to 85 wt %, zinc of 0.2 to 5 wt %, and lead (Pb) of 0 to 2 wt % based on the total wt % of the metal of the front electrode.

In the solar cells according to exemplary embodiments described herein, the first conductive type is a p type. The second conductive type may be n type, or vice versa. The semiconductor substrate may be a single crystal silicon substrate or a polycrystalline silicon substrate. The second conductive type semiconductor layer uses the semiconductor substrate as a base and it serves as an emitter that forms a pn junction at an interface with the substrate.

The second conductive type semiconductor impurity concentration of the second conductive type semiconductor layer may be $1\times10^{16}$ to $1\times10^{21}$ atom/cm$^3$. The second conductive type semiconductor impurity concentration of the second conductive type semiconductor layer may have a concentration gradient from a high concentration to a low concentration within a range of $1\times10^{16}$ to $1\times10^{21}$ atom/cm$^3$ going from the surface to the pn junction interface. Because the second conductive type semiconductor layer is as thin as 100 nm to 500 nm and has the concentration gradient of the semiconductor impurity within the shallow emitter layer, the high concentration impurity doping area of the surface of the emitter layer is relatively narrow compared to existing emitter layers, such that the dead layer is minimized to prevent the recombination of carriers.

Further, the sheet resistance of the second conductive type semiconductor layer is 60 to 120 Ω/square. Thus, solar cells according to the exemplary embodiments may be High Rs cells. The second conductive type semiconductor layer and the antireflective layer in the solar cell may be formed in two layers or more. The rear electrode may be a metal other than zinc (Zn) and it may include aluminum (Al) or silver (Ag), but it is not limited thereto.

A solar cell according to exemplary embodiments may include a dielectric layer formed on the rear surface of the first conductive type semiconductor substrate. The rear electrode then penetrates through the dielectric layer and contacts the rear surface of the first conductive type semiconductor substrate.

Further, according to exemplary embodiments, the rear electrode may be formed throughout the rear surface of the semiconductor substrate but may be a back contact rear electrode formed by being partially patterned. In the case of the back contact rear electrode, the rear part of the semiconductor substrate in which the rear electrode does not exist is formed with the dielectric layer, making it possible to prevent damage to the solar cell.

In a solar cell according to exemplary embodiments, an interface between the rear surface of the first conductive substrate and the rear electrode may be formed with a back surface field (BSF). The back surface field (BSF) may be formed at the interface between the rear electrode and the semiconductor substrate regardless of the mounting form of the rear electrode, making it possible to have the rear field effect of the solar cell in order to prevent the recombination of pairs of separated electrons and holes, thereby reducing the leakage current, so as to have good ohmic contact.

Still further, there is provided a fabrication method of a solar cell according to the exemplary embodiments, comprising: forming a second conductive type semiconductor layer having a depth of 100 nm to 500 nm by doping a second conductive type semiconductor impurity opposite to a first conductive type on a front part of a first conductive type semiconductor substrate; forming an antireflective layer on the second conductive type semiconductor layer; printing a front electrode paste on the antireflection film; printing a rear electrode paste on a rear surface of the first conductive type semiconductor substrate; heat-treating the front electrode paste to contact to the second conductive type semiconductor layer by penetrating through the antireflection film; and heat-treating the rear electrode paste. The heat treatment of the front electrode paste and the heat treatment of the rear electrode paste may be performed at the same time or at different times.

The front electrode paste includes a first component including silver (Ag) or a metal alloy containing silver, a second component including zinc (Zn), a leaded or lead-free glass frit, and a resin binder that is dispersed in an organic medium. According to one exemplary embodiment, the second component may further include at least one selected from a group consisting of silicon (Si), aluminum (Al), copper (Cu), manganese (Mn), bismuth (Bi), phosphorous (P), boron (B), barium (Ba), and palladium (Pd).

The rear electrode paste is not necessarily limited and may use a known aluminum paste, aluminum silver paste, or the like. The rear electrode paste may or may not include zinc (Zn). However, the process forms the front electrode using an electrode paste according to exemplary embodiment as described herein.

In the fabrication method the sheet resistance of the second conductive type semiconductor layer formed on the semiconductor substrate may be formed in high resistance unlike the sheet resistance of the emitter layer of existing solar cells, such that it can be manufactured as a High Rs cell.

The electrode paste can be applied to a general silicon solar cell as well as High Rs cells and, in particular, when using the existing electrode paste at the time of forming the front electrode of a High Rs cell, the problems associated with short circuit caused during the firing process are reduced.

The second conductive type semiconductor layer of a High Rs cell has high sheet resistance, wherein the sheet resistance is within a range of 60 to 120 Ω/square. This is higher than the sheet resistance of the emitter of existing solar cells, which is 40 to 50 Ω/square. Further, the second conductive type semiconductor impurity concentration of the second conductive type semiconductor layer of the High Rs cell may be $1\times10^{16}$ to $1\times10^{21}$ atom/cm$^3$. Still further, in the fabrication method of the solar cell, the antireflective layer may be formed in two layers or more.

The manufacturing method may further comprise forming a dielectric layer on the upper part of the second conductive type semiconductor layer or the lower part of the first conductive type semiconductor substrate. The process may be accomplished prior to the forming the rear electrode. Preferably, it may be formed prior to the forming the antireflection film.

The dielectric layer may be silicon oxide (SiOx) or silicon nitride (SiNx), but it is preferably silicon dioxide (SiO$_2$). The dielectric layer is formed by any one of atmospheric pressure chemical vapor deposition (APCVD), low pressure chemical vapor deposition (LPCVD), plasma enhanced chemical vapor deposition (PECVD), sputtering deposition, electron beam deposition, and a spin-on process. However, the spin-on process is preferred.

The fabrication method may further include forming at least one opening in the dielectric layer after forming the dielectric layer, such that the rear electrode can contact the rear surface of the first conductive type semiconductor substrate through the opening part. In other words, when forming the dielectric layer on the lower part of the first conductive type semiconductor substrate, the process of forming the rear electrode through the opening by patterning the opening should be accomplished. The opening may be formed by patterning for example, a photolithography method, an optical scribing method, a mechanical scribing method, a plasma etching method, a wet etching method, a dry etching method, a lift-off method, and a wire mask method.

The fabrication method may also involve applying the rear electrode paste on the dielectric layer after forming the dielectric layer and simultaneously irradiating the dielectric layer and the rear electrode paste layer using a laser, such that the rear electrode contacts the rear surface of the first conductive type semiconductor substrate. The irradiating time and strength of the laser are not particularly limited but must be sufficient if both the dielectric layer and the rear electrode paste layer are fired by high heat and the rear electrode penetrates through the dielectric layer to contact to the rear surface of the first conductive type semiconductor substrate.

The thermal firing temperature and time of the printed paste are not particularly limited but, preferably, the thermal firing temperature (heating temperature) may be 800° C. to 950° C. The thermal firing time (heating time) may be 1 to 2 seconds.

The fabrication method may further comprise texturing the substrate when preparing the semiconductor substrate, wherein the texturing may be any one of a wet chemical etching method, a dry chemical etching method, an electrochemical etching method, or a mechanical etching method. But the fabrication method is not necessarily limited thereto.

The electrode paste has more excellent contact characteristics than the existing electrode paste and controls the fire through in process of forming the electrode. In particular, an electrode paste is provided which can be applied to the High Rs cell including the emitter layer having a higher sheet resistance than existing silicon solar cells. The paste has excellent contact ability for the ultra-thin emitter layer doped at the predetermined impurity doping concentration of the High Rs cell.

Also, an emitter layer having high sheet resistance to improve the photovoltaic efficiency of the entire solar cell can be provided, and the development and industrial application of the electrode paste using the existing process in manufacturing the high efficiency solar cell can be facilitated. Therefore, a high efficiency solar cell with improved performance at a lower cost or at least approximately equal to the production cost of existing solar cells can be provided.

Hereinafter, preferred embodiments will be described in detail with reference to the accompanying drawings. FIGS. 1 to 5 are cross-sectional views sequentially showing the fabrication method of a solar cell according to exemplary embodiments.

First, an n type emitter layer 2 is formed on the surface of a substrate by doping an n type semiconductor impurity on the p type semiconductor substrate 1.

Although not shown in FIG. 1, the n type semiconductor impurity is doped on a front surface and a rear surface of the substrate as well as both sides thereof. Thereafter, the doping layer on the side is removed through an edge isolation process and in a process of forming a rear electrode, since the n type semiconductor impurity layer is compensated, FIG. 1 shows only the n type doping layer (n type emitter) 2.

The n type emitter layer 2 forms a pn junction at the interface with the p type semiconductor substrate 1. The n type emitter layer may be formed using a deposition process and a known semiconductor impurity. The solar cell according to the exemplary embodiments may be a High Rs cell having sheet resistance in the range of 60 to 100 Ω/square, wherein the n type emitter layer 2 of the High Rs cell can control the thermal diffusion process of the n type semiconductor impurity so that the n type semiconductor impurity concentration is $1\times10^{16}$ to $1\times10^{21}$ atom/cm$^3$ and the depth thereof is 100 nm to 500 nm.

Although not shown in FIG. 1, prior to the n type emitter deposition process, the surface of the p type semiconductor substrate 1 may be subjected to a texturing process. The texturing process may involve a wet chemical etching method, a dry chemical etching method, an electrochemical etching method, a mechanical etching method, or the like. Because the substrate may be is an ultra-thin type substrate, that is, the thickness is very small, the texturing process is more likely to involve a chemical etching method rather than a mechanical etching method. In so doing, causing damage or defect to the substrate is minimized. Thereafter, the substrate is subjected to a cleaning process to remove an organic and/or inorganic material.

In the next process, as illustrated in FIG. 2, an antireflective layer 3 is formed on the n type emitter layer 2 which, in turn, was formed on the front surface of the substrate 1. FIG. 2 shows that the antireflective layer 3 is formed in a single layer. However, the process but is not limited thereto. Therefore, the antireflective layer 3 may comprise a plurality of layers. The material forming the antireflective layer is not particularly limited, but for to materials which can prevent light leakage out of the solar cell. Preferably, a silicon oxide film, a silicon nitride film, or a film comprising a mixture of both may be used. The material used for the antireflective layer may, specifically, use a dielectric material, for example, a single layer of SiNx, two layers of SiNx/SiON or SiNx/SiOx, or three layers of SiOx/SiNx/SiOx. However, once again, the material is not limited thereto. The antireflective layer 3 minimizes the reflectance of light from the solar cell and it also serves as a passivation layer.

Next, a front electrode 4 is formed on the antireflective layer 3 by patterning, as shown in FIG. 3. More specifically, the front electrode 4 is formed by patterning the electrode paste on a predetermined area of the antireflection film 3, thermally firing the paste, causing it to passthrough the anti-reflection film, and making contact with the n type emitter layer 2.

The electrode paste has a first component including silver (Ag), or a metal alloy containing Ag, a second component including zinc (Zn) and at least one other component selected from the group consisting of silicon (Si), aluminum (Al), copper (Cu), manganese (Mn), bismuth (Bi), phosphorous (P), boron (B), barium (Ba), palladium (Pd), a leaded or lead-free glass frit, and a resin binder that is dispersed in an organic medium. It is preferable that the second component is 2 to 5 wt % based on the total wt % of the composition. Further, the first component is 80 to 85 wt % based on the total wt % of the composition. Still further, the glass frit may or may not include lead, and if it does include lead, the content of lead may be 1 to 3 wt % based on the total wt % of the composition. When the weight of the metal in the electrode paste material makes up the total weight, silver (Ag) may be 50 to 85 wt %, zinc (Zn) may be 0.2 to 5 wt %, and lead (Pb) may be 0 to 2 wt %.

Table 1 below illustrates the wt % ratio of the metal for the electrode paste. In Example 1, the electrode paste is lead (Pb)-free, as indicated. In example 2, the electrode paste contains lead.

TABLE 1

|  | Wt % | | | | | | | | | | |
| --- | --- | --- | --- | --- | --- | --- | --- | --- | --- | --- | --- |
|  | Ag | Pb | Zn | Al | Cu | Mn | Bi | P | Si | B | Ti |
| Comparative Example | 80 | 3.3 | 0.01 | 0.07 | <0.01 | <0.01 | 0.01 | 0.04 | 0.2 | 0.01 | <0.01 |
| Example 1 | 80 | — | 0.005 | 0.01 | 0.005 | 0.09 | 3.5 | 0.01 | 0.13 | 0.025 | — |
| Example 2 | 85 | 0.31 | 0.2 | 0.095 | 0.005 | 0.005 | 0.005 | 0.035 | 0.3 | 0.025 | — |

Comparative Example: Existing front electrode paste - leaded (Pb)

The weight ratios of the metal components for Examples 1 and 2, as indicated in Table 1, are exemplary, and not limiting. Preferably, the ratio of zinc (Zn) in the paste is mixed in the range of 0.2 to 5 wt % as illustrated.

In the paste according to the above Table 1, the lead content in the metal largely decreases, while the zinc content increases when one compares Example 2 with the comparative example. When Example 1 is compared with the comparative example, bismuth (Bi) increases instead of zinc. The content of bismuth increases so that the paste characteristics can be better achieved.

FIG. 4 illustrates a rear electrode 5 being formed on the rear surface of the p type semiconductor substrate 1. Like the front electrode 4, the rear electrode 5 is formed using the known electrode forming process. the rear electrode 5 may be formed at the same time or at a different time than the front electrode 4. Accordingly, an electrode paste is applied and then thermally fired to complete the rear electrode 5.

The thermal firing temperature of the front electrode and the rear electrode is 800° C. to 950° C. and the thermal firing time is 1 to 2 seconds. Again, this range of temperatures is exemplary. The rear electrode 5 may be formed by applying an aluminum (Al) paste or an alloy paste of aluminum silver (AlAg), or the like, and then thermally firing the paste.

As shown in FIG. 5, the solar cell, according to exemplary embodiments, is subject to a thermoplastic process such that a back surface field (BSF) 6 is formed on the rear surface of the p type silicon substrate 1 as a high concentration doping layer of the p type semiconductor impurity. The back surface field (BSF) 6, which is doped with a p type impurity at a high concentration, serves to induce electron and hole pairs that are separated by received light and then further separated to prevent the electron hole pairs from being re-combined. This makes it possible to increase the efficiency of the solar cell.

FIG. 5 is a cross-sectional view of a solar cell having the rear electrode 5 deposited over the rear surface of the semiconductor substrate 1. In contrast, FIG. 6 illustrates a back contact solar cell where the rear electrode 5 partially contacts the semiconductor substrate 1. FIG. 6 also illustrates that using the electrode paste may include a dielectric layer 7 which serves as a passivation layer between the n type emitter layer 2 and the antireflective layer 3. A dielectric layer 7 may also be formed on the rear surface of the semiconductor substrate 1 and then, the rear electrode 5 may be formed thereon.

After the dielectric layer 7 is formed, then openings are formed so that the rear electrode 5 partially contacts the substrate 1. The rear electrode 5 partially contacts the substrate 1 through these openings which are in the back surface field (BSF) 6, as illustrated. The dielectric layers 7 may be silicon oxide (SiOx) or silicon nitride (SiNx), but silicon dioxide ($SiO_2$) is preferable.

In the manufacturing method, the dielectric layer 7 may be formed by any one of atmospheric pressure chemical vapor deposition (APCVD), low pressure chemical vapor deposition (LPCVD), plasma enhanced chemical vapor deposition (PECVD), sputtering deposition, electron beam deposition, a spin-on process, or the like. However, a spin-on process is preferable. The openings 6 for the rear electrodes are formed by a photolithography method, an optical scribing method, a mechanical scribing method, a plasma etching method, a wet etching method, a dry etching method, a lift-off method, a wire mask method, or the like.

FIG. 7 shows a flow chart of a manufacturing method, according to exemplary embodiments for a solar cell as described above. The fabrication method involves forming an unevenness structure (i.e., texture) on the substrate 1 by employing a texturing process that will minimize possible damage to the substrate surface (S10). The textured surface increases the light receiving area to increase, in turn, light trapping.

Thereafter, a cleaning process for removing organic and/or inorganic material is accomplished (S20). Then, in order to manufacture an inverse conductive n type emitter layer, a pn junction structure is formed by thermally diffusing n type semiconductor impurities of group-V elements such as phosphorus (P), arsenic (As), antimony (Sb), and the like, onto the p type substrate (S30). The process of thermal diffusion generally forms an emitter layer of 500 nm or more but, in the present invention, it is important to maintain the thermal diffusion depth of the pn junction to a depth of 100 to 500 nm.

Thereafter, a silicon nitride film, which serves as an antireflective coating on the n type emitter layer, is formed. To achieve this, a process such as plasma enhanced chemical vapor deposition (PECVD) may be employed (S40).

A silver (Ag) electrode is then formed on the antireflective coating by a screen printing process, while an aluminum (Al) rear electrode is also formed using a screen printing or similar process (S50). More specifically, an electrode paste according to exemplary embodiments is applied to the front part of the light receiving area using a screen printing method. The sequence of forming the rear electrode and the front electrode is not limited to forming either electrode before the other.

After the screen printing process, a drying process (S60) and an edge isolation process are performed (S70) and the high temperature simultaneous firing proceeds in order to form the back surface field (BSF) on the rear surface as explained above (S80). The thermal firing process increases the contact between the front electrode and the front surface. The thermal firing process for the front part and the rear part does not have to be a simultaneous firing process and they may each be fired separately.

Again, the method illustrated in FIG. 7 is exemplary. The sequence of the method is only one embodiment and is not limited thereto.

FIG. 8 is a graph of comparing the doping concentrations of semiconductor impurity according to the sputter depths of emitter layers in a High Rs cell and an existing well-known solar cell. The graph of FIG. 8 shows results based on data relating to an n type semiconductor impurity diffused into the wafer according to the thickness of the n type emitter layer, in particular, the concentration of phosphorus (P), in the process for forming the pn junction among the manufacturing processes of the solar cell manufactured using a 156 mm single crystal wafer.

In an existing solar cell, the data for which is indicated by -♦-, it can be appreciated that the n type impurity concentration of the emitter layer is formed at a high concentration of $1.0 \times 10^{21}$ atoms/$cm^3$ at the surface and then is diluted to the concentration of $1.0 \times 10^{16}$ atoms/$cm^3$. In particular, it can be appreciated that when $1.0 \times 10^{17}$ atoms/$cm^3$ is considered as a reference, the depth of the emitter layer is 600 nm or more.

In comparison, the High Rs cell, according to exemplary embodiments of the present invention, the data for which is are indicated by -▲-, it can be appreciated that when $1.0 \times 10^{17}$ atoms/$cm^3$ is considered as a reference, it has an emitter layer having a very thin depth where the sputter depth is about 350 nm. Further, the High Rs cell has an emitter layer with high sheet resistance, which is 60 Ω/square or more and as can be appreciated from FIG. 8, it has the depth of the n type impurity doping section that is even thinner than the existing solar cell, making it possible to implement an ultra-thin solar cell and improve the photovoltaic efficiency.

In addition, the high concentration doping section at the surface of the emitter layer is considered a dead layer and, as shown in FIG. 8, the n type impurity doping concentration is a high concentration $1.0 \times 10^{21}$ atoms/$cm^3$ to $1.0 \times 10^{22}$ atoms/$cm^3$. Because the corresponding section hinders the generated electrons from forming a current due to the extra n type impurity concentration, the dead layer section should be short to improve efficiency. As can be appreciated from FIG. 8, the High Rs cell has the relatively short dead layer section compared to existing solar cells, such that the electron focusing probability increases, making it possible to improve the efficiency.

The paste used for forming the front electrode which contacts the very thinly formed emitter layer of the High Rs cell was described above with reference to Table 1. Using a paste having components as shown in Table 1 are suitable and of sufficient efficiency for High Rs cells.

Comparing the efficiency between solar cells manufactured by applying the paste according to exemplary embodiments and existing solar cells manufactured using existing electrode paste is as follows in Tables 3 and 4.

TABLE 2

|  | Jsc (mA/cm²) | Voc (mV/cm²) | FF (%) | Efficiency (%) |
|---|---|---|---|---|
| Conventional Cell | 32.2 | 611 | 77.3 | 15.31 |
| High Rs Cell-paste A | 32.8 | 615 | 77.4 | 15.62 |

TABLE 3

|  | Jsc (mA/cm²) | Voc (mV/cm²) | FF (%) | Efficiency (%) |
|---|---|---|---|---|
| Conventional Cell | 33.85 | 622 | 79.5 | 16.75 |
| High Rs Cell-paste A | 34.6 | 625 | 79 | 16.96 |

With reference to Table 2, both the existing (i.e., conventional) solar cell and the High Rs cell use a 156 mm polycrystalline silicon wafer. In FIG. 3, a 156 mm single crystal silicon wafer is used. Unlike the existing solar cell, the High Rs cell is manufactured by forming the front electrode using paste A according to exemplary embodiments of the present invention, as described above. In tables 2 and 3, paste A comprises the metal composition of Example 2 in Table 1.

With continued reference to Tables 2 and 3, the difference in photovoltaic efficiency, as shown, is caused by the difference between the single crystal silicon and polycrystalline silicon wafer. Generally, the efficiency of the single crystal silicon solar cell is greater. However, the efficiency of the High Rs cell, which uses paste A according to exemplary embodiments of the present invention, is greater than the efficiency of the existing solar cell regardless whether single crystal silicon or polycrystalline silicon is employed.

When a High Rs cell uses existing (i.e., conventional) paste for the front electrode, the electrode passes through the very thinly formed emitter layer to reach and contact with the base substrate. The electrode and the substrate are thus short-circuited, and the solar cell cannot be manufactured. Therefore, it is realized that in the manufacturing process of a silicon solar cell, and in particular, a high efficiency solar cell such as the High Rs cell described above, the paste more smoothly controls the speed at which the electrode is formed.

Those skilled in the art will appreciate that various modifications and variations can be made in the present invention without departing from the spirit or scope of the inventions. Also, the substances of each constituent explained in the specification can be easily selected and processed by those skilled in the art from the well-known various substances. Also, those skilled in the art can remove a part of the constituents as described in the specification without deterioration of performance or can add constituents for improving the performance. Furthermore, those skilled in the art can change the order to methodic steps explained in the specification according to environments of processes or equipment. Thus, it is intended that the present invention covers the modifications and variations of this invention provided they come within the scope of the appended claims and their equivalents.

What is claimed:

1. A solar cell comprising:
   a semiconductor substrate comprising a first conductive type material;
   a semiconductor layer comprising a second conductive type material formed on a front surface of the semiconductor substrate, wherein the first conductive type material is different than the second conductive type material;
   an antireflective layer formed on the semiconductor layer;
   a front electrode passing through the antireflective layer and contacting the semiconductor layer; and
   a rear electrode formed on a rear surface of the semiconductor substrate,
   wherein the depth of the semiconductor layer is 100 nm to 500 nm, and
   wherein the front electrode comprises a first component including silver (Ag) and a second component including zinc (Zn) and bismuth (Bi), wherein the second component includes more bismuth (Bi) than zinc (Zn) based on wt %.

2. The solar cell according to claim 1, wherein the first component is 75 to 95 wt % and the second component is 2.5 to 8 wt % based on the total wt % of the front electrode composition.

3. The solar cell according to claim 1, wherein the front electrode further includes lead (Pb), and wherein silver (Ag) is 50 to 85 wt %, zinc (Zn) is 0.2 to 5 wt %, and lead (Pb) is equal to or less than 2 wt %, based on the total metal wt % of the front electrode.

4. The solar cell according to claim 1, wherein the sheet resistance of the semiconductor layer is 60 to 1200 Ω/square.

5. The solar cell according to claim 1, wherein the impurity concentration of the second conductive type material of the semiconductor layer is $1 \times 10^{16}$ to $1 \times 10^{21}$ atom/cm³.

6. The solar cell according to claim 1, wherein the impurity concentration of the second conductive type material of the semiconductor layer has a concentration gradient from a high concentration to a lower concentration within a range of $1 \times 10^{16}$ to $1 \times 10^{21}$ atom/cm³ as going from a front surface of the semiconductor layer to a pn junction interface between the semiconductor layer and the semiconductor substrate.

7. The solar cell according to claim 1, wherein the composition of the front electrode is different than the composition of the rear electrode.

8. The solar cell according to claim 7, wherein the composition of the rear electrode includes aluminum (Al) or silver (Ag).

9. The solar cell according to claim 1, wherein the composition of the rear electrode excludes zinc (Zn).

10. The solar cell according to claim 1, wherein a first dielectric layer is formed between the semiconductor layer and the antireflection layer and a second dielectric layer is formed between the semiconductor substrate and the rear electrode, and wherein the rear electrode passes through the second dielectric layer and makes contact with the rear surface of the semiconductor substrate.

11. The solar cell according to claim 1, wherein the front electrode comprises Pb-free glass fit.

12. The solar cell according to claim 1, wherein the antireflective layer comprises a plurality of layers.

* * * * *